United States Patent
Cashman et al.

(10) Patent No.: US 7,268,584 B1
(45) Date of Patent: Sep. 11, 2007

(54) ADDER CIRCUITRY FOR A PROGRAMMABLE LOGIC DEVICE

(75) Inventors: David Cashman, Toronto (CA); David Lewis, Toronto (CA); Gregg W. Baeckler, San Jose, CA (US); Ketan Padalia, Thornhill (CA)

(73) Assignee: Altera Corporation, San Jose, CA (US)

( * ) Notice: Subject to any disclaimer, the term of this patent is extended or adjusted under 35 U.S.C. 154(b) by 120 days.

(21) Appl. No.: 11/193,125

(22) Filed: Jul. 28, 2005

(51) Int. Cl.
*G06F 7/38* (2006.01)
*H03K 19/177* (2006.01)

(52) U.S. Cl. ................ 326/39; 326/38; 326/40
(58) Field of Classification Search ............ 326/37–41, 326/47
See application file for complete search history.

(56) References Cited

U.S. PATENT DOCUMENTS 5,546,018 A * 8/1996 New et al. .................... 326/38

OTHER PUBLICATIONS

Altera Corporation, "*Glossary*" Jul. 2001, pp. 1-16.
Altera Corporation, "*2. Stratix Architecture*", Stratix Device Handbook, vol. 1, Sep. 2004, pp. 2-1 through 2-142.
Altera Corporation, "*Stratix II, 90-nm High-Performance, High Density FPGAs*", Product Brochure, Nov. 2004, 8 Pages.
Altera Corporation, "*I. Introduction*", Stratix II Device Handbook, vol. 1, May 2005, pp. 1-1 through 1-4.
Altera Corporation, "*2. Stratix II Architecture*", Stratix II Device Handbook, vol. 1, May 2005, pp. 2-1 through 2-104.
Kintisheff, Tsvetan, "*Advantages and Disadvantages of PLDs vs ASIC-s*", Downloaded on Jul. 28, 2005 from: http://www.yeald.com/Yeald/a/17191/advantages_and_disadvantages_of_plds_vs_asci-s.html, 4 Pages.
Kintisheff, Tsvetan, "*Why PLD-s are On The Rise*", Downloaded on Jul. 28, 2005 from: http://www.yeald.com/Yeald/a/17201/why_pld-s_are_on_the_rise.html, 4 Pages.
Xilinx, "*Virtex-4 Family Overview*", Preliminary Product Specification, DS112 (v1.3) Mar. 26, 2005, 9 Pages.

* cited by examiner

*Primary Examiner*—Anh Q. Tran
(74) *Attorney, Agent, or Firm*—Beyer Weaver LLP

(57) ABSTRACT

A PLD having logic blocks capable of performing addition with a constant and non-constant value where the constant value is provided directly to an adder, without first passing it through a look up table. The PLD includes a plurality of logic blocks arranged in a two dimensional array. Row and column interconnects are provided to interconnect the plurality of logic blocks arranged in the two dimensional array. The plurality of logic blocks each include a look up table configurable to perform combinational logic and an adder circuit configured to perform adding functions. Each logic block also includes circuitry configured to directly provide a constant value to the adder circuit without passing the constant value through the look up table. The look up table is therefore available to perform other logic functions that would otherwise have to performed elsewhere on the chip.

27 Claims, 7 Drawing Sheets

ADDER CIRCUITRY FOR A PROGRAMMABLE LOGIC DEVICE

BACKGROUND

1. Field of the Invention

The present invention generally relates to programmable logic devices, and more particularly, to a programmable logic device having logic blocks capable of directly providing a constant value to an adder circuit without first passing the constant value through a look up table.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), programmable registers, adders and other circuitry to implement various logic and arithmetic functions.

One problem with current PLDs is implementing an adding function between a constant value and a non-constant value. With the logic blocks of known PLDs, the constant value is passed through a LUT before providing the constant value to the adders in the logic block. In this mode, the LUT is simply being used as a "conduit", preventing or limiting the LUT from performing other logic functions. As a result, the efficiency of the PLD is degraded.

A higher efficiency PLD having logic blocks capable of performing addition with a constant and non-constant value where the constant value is provided directly to an adder, without first passing it through a LUT, is therefore needed.

SUMMARY OF THE INVENTION

A high efficiency PLD having logic blocks capable of performing addition with a constant and non-constant value where the constant value is provided directly to an adder, without first passing it through a look up table, is disclosed. The PLD includes a plurality of logic blocks arranged in a two dimensional array. Row and column interconnects are provided to interconnect the plurality of logic blocks arranged in the two dimensional array. The plurality of logic blocks each include a look up table configurable to perform combinational logic and an adder circuit configured to perform adding functions. Each logic block also includes circuitry configured to directly provide a constant value to the adder circuit without passing the constant value through the look up table. The look up table is therefore available to perform other logic functions that would otherwise have to be performed elsewhere on the chip. These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
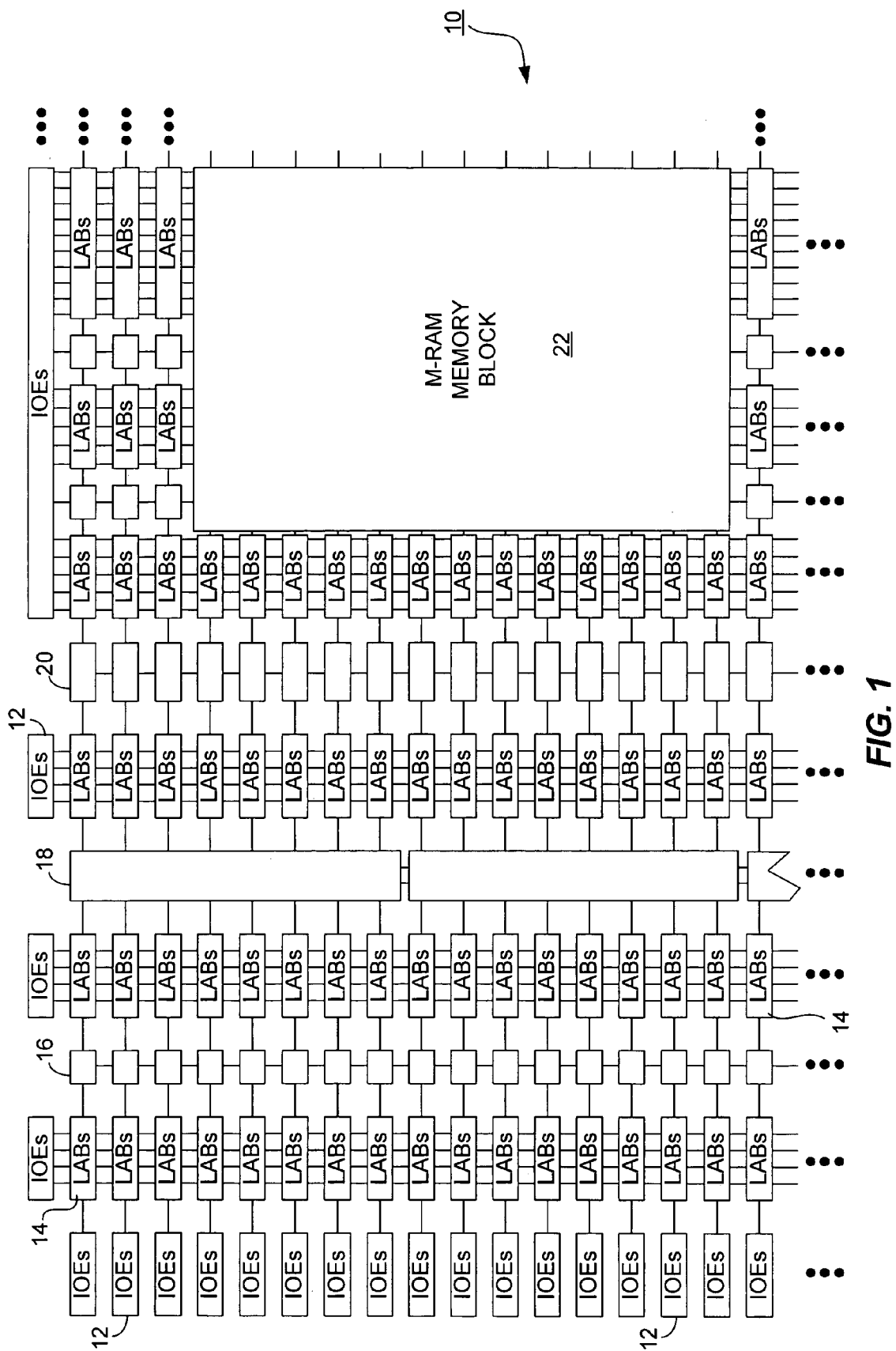
FIG. 1 is a block diagram of a Programmable Logic Device (PLD) which implements the adder function of the present invention.

Referring to FIG. 1, a block diagram of a Programmable Logic Device (PLD) which implements the adder function of the present invention is shown. The PLD 10 includes a two dimensional row and column based architecture including a plurality of Input/Output elements (IOEs) 12 arranged around the periphery of the chip, a plurality of Logic Array blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs, and an M-RAM memory blocks 22 arranged individually at different locations across the device.

In one embodiment, the LABs 14 include a number of adaptive logic modules (ALMs) (not visible in the figure) which are the basic logic building blocks for implementing user defined logic functions. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits. For more information on the PLD architecture 10 illustrated in FIG. 1, see for example the Stratix II Architecture, Functional Description, pages 2-1 through 2-104, from the Altera Corporation "Stratix II Device Handbook", Volume 1, May, 2005, and incorporated by reference herein for all purposes. It should be noted that the PLD architecture illustrated in FIG. 1 is exemplary and in no way should be construed as limiting the present invention. The adder circuitry of the present invention can be used with any type of programmable logic device architecture.

Figure 2:
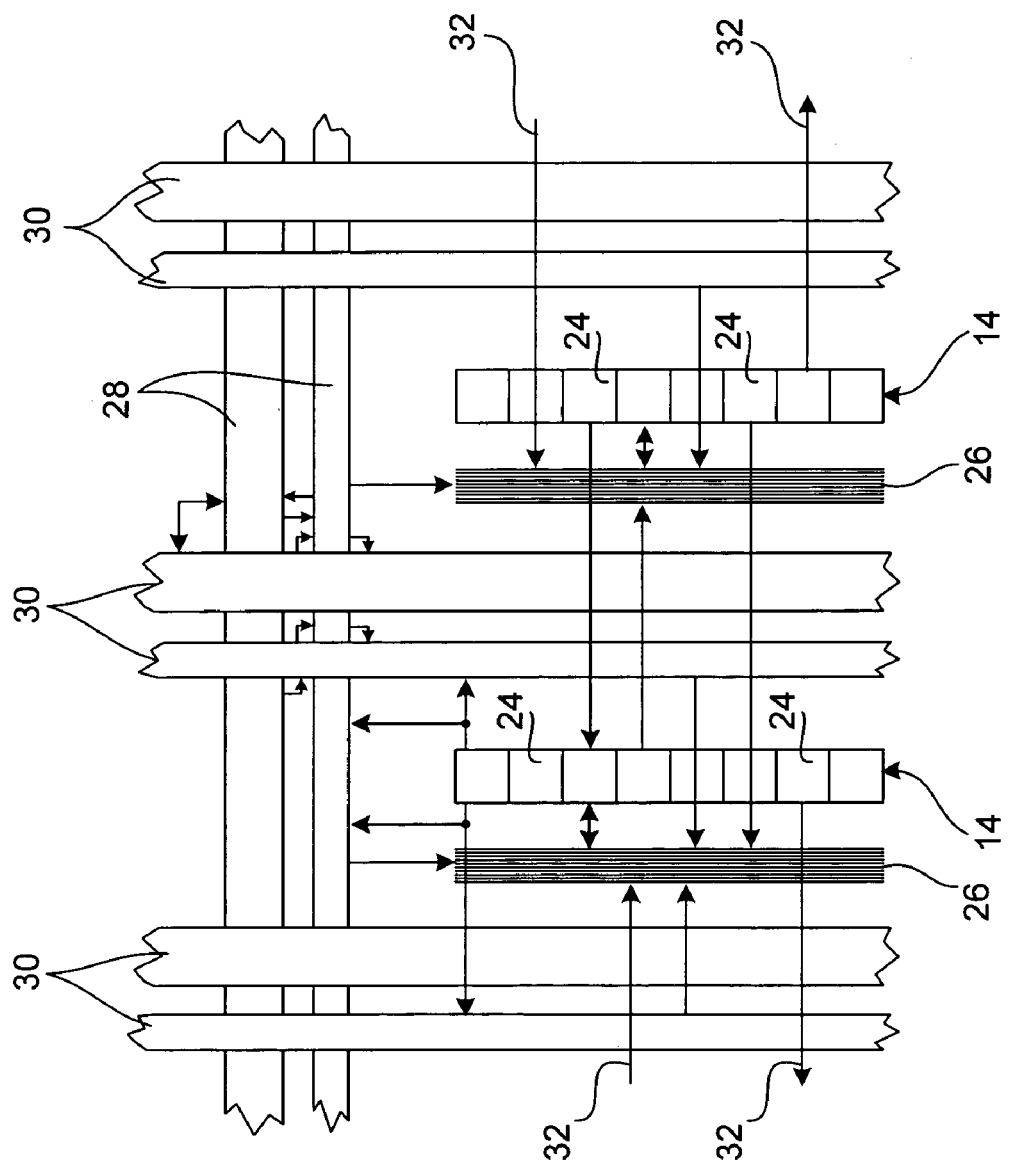
FIG. 2 is a block diagram of a logic array block (LAB) in the PLD which implements the adder function of the present invention.

Referring to FIG. 2, a block diagram of a logic array block (LAB) in the PLD 10 capable of performing the adder function of the present invention is shown. Each LAB 14, in the embodiment shown, includes eight Adaptive Logic Module (ALMs) 24 and a local interconnect 26 for driving or receiving signals between the ALMs 24 in the same LAB 14. The local interconnects 26 can also be driven by: (i) row interconnects 28 of varying speed and lengths; (ii) column interconnects 30 of varying speed and lengths; and (iii) direct link connections 32 from: (a) neighboring LABs 14; (b) RAM blocks 16; (c) DSP blocks 18; (d) RAM blocks 20; and (e) M-RAM blocks 22. Again, the specific LAB architecture illustrated in FIG. 2 is exemplary and should in no way be construed as limiting the present invention.

Figure 3:
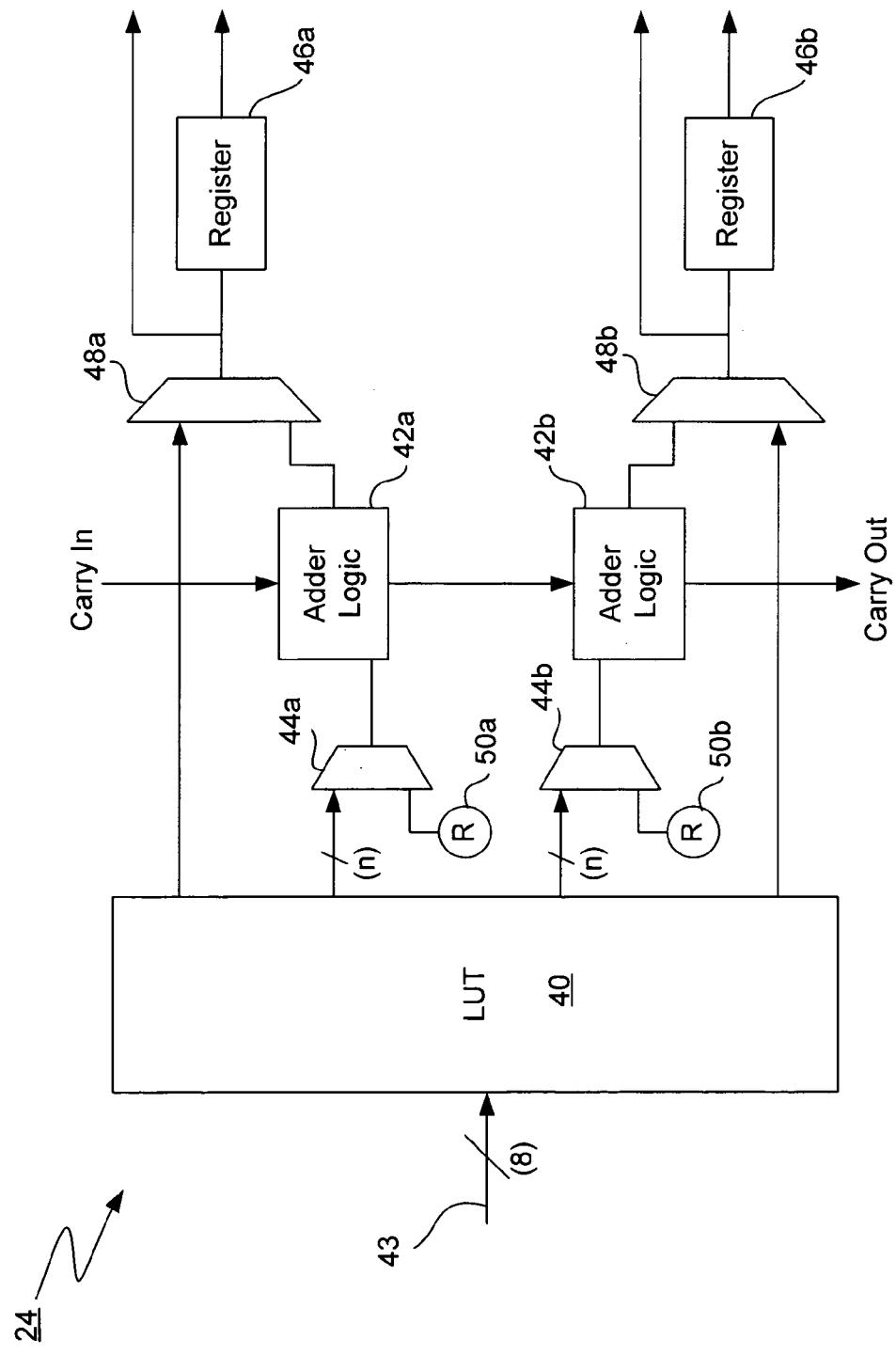
FIG. 3 is a block diagram of an Adaptive Logic Module (ALM) used in the LAB which implements the adder function of the present invention.

Referring to FIG. 3, a high level block logic diagram of an ALM 24 used in the LAB 14 is shown. The ALM 24 includes a Look Up Table (LUT) 40, two adder circuits 42a and 42b, two muxes 44a and 44b coupled between the LUT 40 and the adders 42a and 42b respectively, two registers 46a and 46b, and additional muxes 48a and 48b coupled between the adders 42a and 42b and registers 46a and 46b respectively. In one embodiment, the LUT 40 is configured to receive eight (8) decode input signals 43 and is capable of generating one of a possible number of sixty four ($2^8$=64) outputs. In other embodiments, the LUT 40 can be configured as a "fractional" LUT. In other words, the large LUT 40 can be broken down or fractured into a number of smaller LUTs, for example, two (2) four-input LUTs, two (2) five-input LUTs with some inputs common to both, a five (5) input LUT and a three (3) input LUT, four (4) 4-input LUTs with some common inputs, etc. The outputs of the LUT 40 can be applied to either muxes 44a and 44b or directly to registers 46a and 46b through muxes 48a and 48b respectively. The outputs of adders 42a and 42b are applied to the inputs of muxes 48a and 48b respectively. The outputs of muxes 48a and 48b are applied directly to or bypass registers 46a and 46b respectively.

Muxes 44a and 44b are each coupled to receive up to (n) outputs from the LUT 40 and the contents of a configuration RAM (CRAM) cell 50a and 50b respectively. When a PLD is programmed, configuration data is downloaded onto the chip and stored in individual configuration RAM cells. This configuration data is used to program the interconnect and logic of the device to implement the desired logic functions as defined by the user. A user may wish to program CRAM cells 50a and 50b with constant values and then use these stored constant values as an operand in an addition operation with non-constant values using the adders 42a and 42b respectively. With the present invention, these constant values can be provide to the adders 42a and 42b, directly, through the muxes 44a and 44b, and not through the LUT 40 as is practiced in prior art devices. The LUT 40 is therefore available to perform other logic functions that would otherwise have to performed elsewhere on the chip. This arrangement therefore increases the efficiency of the PLD 10.

Figure 4:
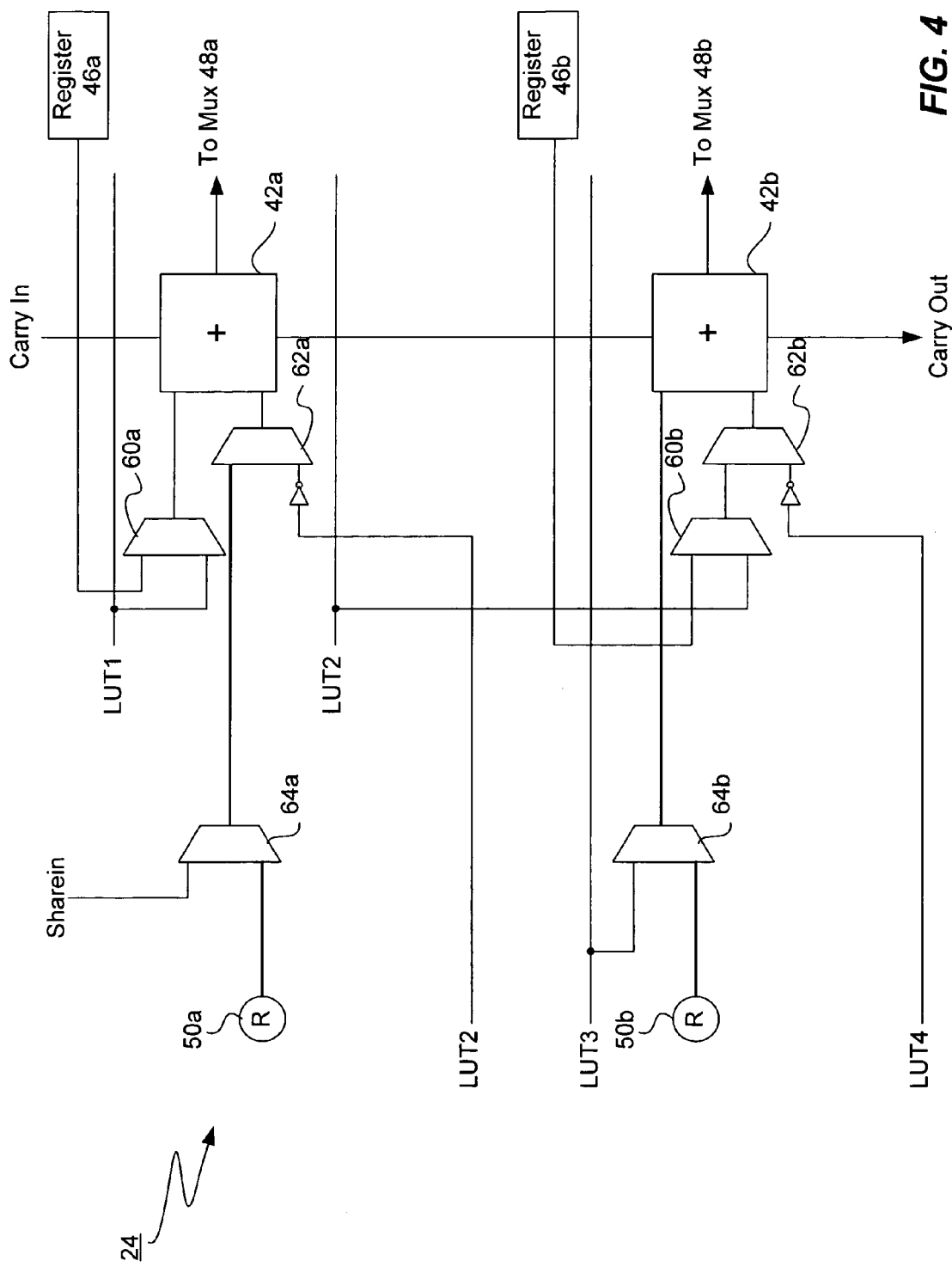
FIG. 4 is a logic diagram illustrating one embodiment of the adder function implemented by the ALM according to the present invention.

Referring to FIG. 4, a logic diagram illustrating one embodiment of the adder function of the present invention implemented by the ALM 24 is shown. In FIG. 4, the adder 42a is configured to receive a CarryIn input from the previous adder. The output of the adder 42a is provided to mux 48a, as illustrated in FIG. 3. The adder 42a is also configured to receive inputs from muxes 60a and 62a. Mux 60a is configured to receive at its inputs the content of register 46a and a first signal LUT 1 from LUT 40. Mux 62a is configured to receive a second signal LUT 2 from LUT 40 and the output of mux 64a. Mux 64a is configured to receive a ShareIn input and the contents of CRAM cell 50a. The ShareIn signal is an output from a LUT 40 that is produced by the look-up table configuration bits in the top half of the ALM 24. For more details on the ShareIn signal, see the aforementioned Stratix II Device Handbook. The adder 42b is configured to receive a CarryIn input from the previous adder 42a. The output of adder 42b is provided to mux 48b, as illustrated in FIG. 3. The adder 42b is also configured to receive inputs from muxes 62b and 64b. Mux 62b is configured to receive at its inputs a fourth signal LUT 4 from LUT 40 and the output of mux 60b. Mux 60b is configured to receive at its inputs the content of register 46b and the second output signal LUT 2 from LUT 40. Mux 64b is configured to receive a third input signal LUT 3 from LUT 40 and the contents of CRAM cell 50b.

To implement the adder function of the present invention, muxes 64a and 62a are configured to select the contents of CRAM cell 50a. In this manner, the content of CRAM cell 50a is provided directly to the input of adder 42a, without having to be first passed through the LUT 40. Similarly, the content of CRAM cell 50b is provided to adder 42b by selecting the CRAM cell 50b input to mux 64b. For the sake of illustration, the signal paths for providing the contents of CRAM cells 50a and 50b to adders 42a and 42b are provided in bold in the figure. When the aforementioned adder function is implemented, the LUT outputs are not used by the adders 42a and 42b. Consequently, the entire LUT 40 may be used to implement other combinational logic, effectively reducing the number of ALMs 24 required to for each pair of adder bits specified by the user's design.

It also should be noted that with the mux arrangement illustrated in FIG. 4, the contents of the registers 46a and 46b can be provided to the adders 42a and 42b respectively. By selecting the register 46a input at mux 60a, the content of the register is provided to adder 42*a*. Similarly, by selecting the register 46*b* input at muxes 60*b* and 62*b*, the contents are provided to adder 42*b*. This allows one to implement a counter, one of the most common arithmetic structures that requires addition by a constant, without having to either use the LUT 40 to pass in the signal from the register, or to route the signal from the register output back to the arithmetic input. In one embodiment, a counter is implemented by initializing the register with some value, often but not necessarily zero (0), and at each clock cycle, the register output is added to some constant, the value of which is then stored in the register, to be used in the next clock cycle.

The logic of FIG. 4 is also flexible and allows for more general addition operations. For example, addition operations involving a constant from a CRAM cell 50 and another value besides the contents of the local register 46, such as a LUT signal from LUT 40, can be performed. Signals LUT 1 and LUT 2 can both be provided to the input of adder 42 by appropriately selecting the outputs of mux 60*a* and mux 62*a* respectively. Similarly, signals LUT 3 and LUT 4 can be provided to adder 42*b* by appropriately controlling the outputs of muxes 60*b*, 62*b*, and 64*b*. Accordingly, the logic diagram of FIG. 4 provides a great deal of flexibility, allowing the LUT 40 to be configured to: (i) perform combinational logic while the adders 42*a* and 42*b* are performing an independent adder operation; (ii) provide input signals to the adders 42*a* and 42*b* as operands for an adding operation while not performing any other combinational logic functions; (iii) or a combination of (i) and (ii) above. In other words, the LUT 40 can be fractured where a first portion is used to provide one or more LUT output signals to an adder 42*a* and/or 42*b* for performing an adding operation while the reminder is used to perform combinational logic.

Figure 5:
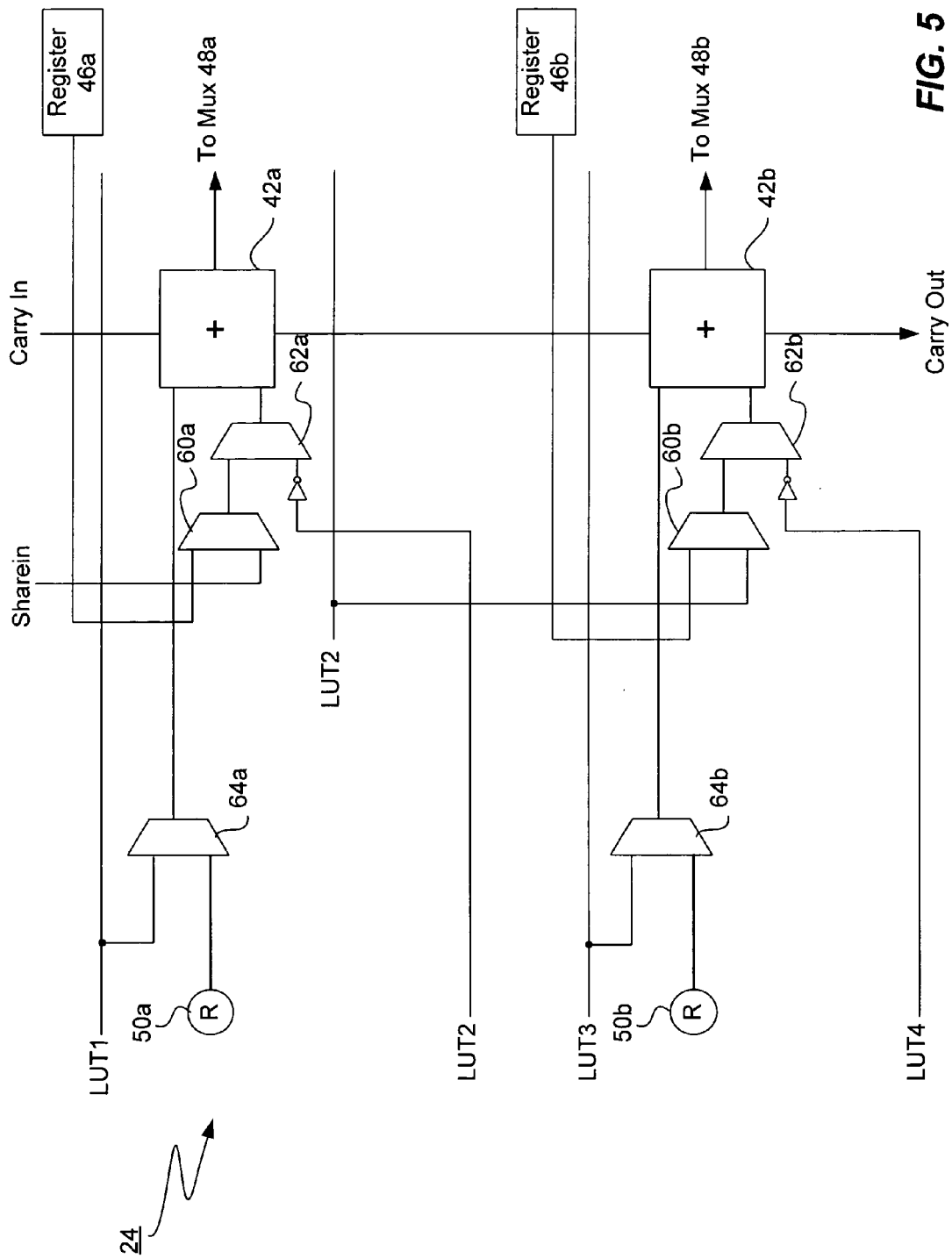
FIG. 5 is a logic diagram illustrating another embodiment of the adder function implemented by the ALM according to the present invention.

Referring to FIG. 5, a logic diagram illustrating another embodiment of the adder function implemented by the ALM 24 according to the present invention is shown. This version of the adder is essentially the same as that illustrated in FIG. 4, but is more symmetrical, i.e., the top portion of the logic circuit is arranged in the identical fashion as the bottom portion of the logic circuit. The main difference between the logic circuits of FIGS. 4 and 5 are the arrangement of the inputs to the muxes 60*a*, 62*b* and 64*a* in the upper half of the two diagrams. In FIG. 5, mux 60*a* is configured to receive the ShareIn signal and the content of register 46*a* at its inputs. Mux 62*a* is configured to receive signal LUT 2 and the output of mux 60*a*. Mux 64*a* is configured to receive signal LUT 1 and the content of CRAM cell 50*a*. With this arrangement, the inputs to the muxes 60*a*, 62*a* and 64*a* are symmetrical with muxes 60*b*, 62*b* and 64*b* respectively. The operation of the logic circuit of FIG. 5 is essentially identical to that described above with the caveat that the control of the three muxes 60*a*, 62*a* and 64*b* needs to be altered to make sure the desired inputs are provided to the adder 42*a*. Otherwise the two logic circuits are essentially the same.

Figure 6:
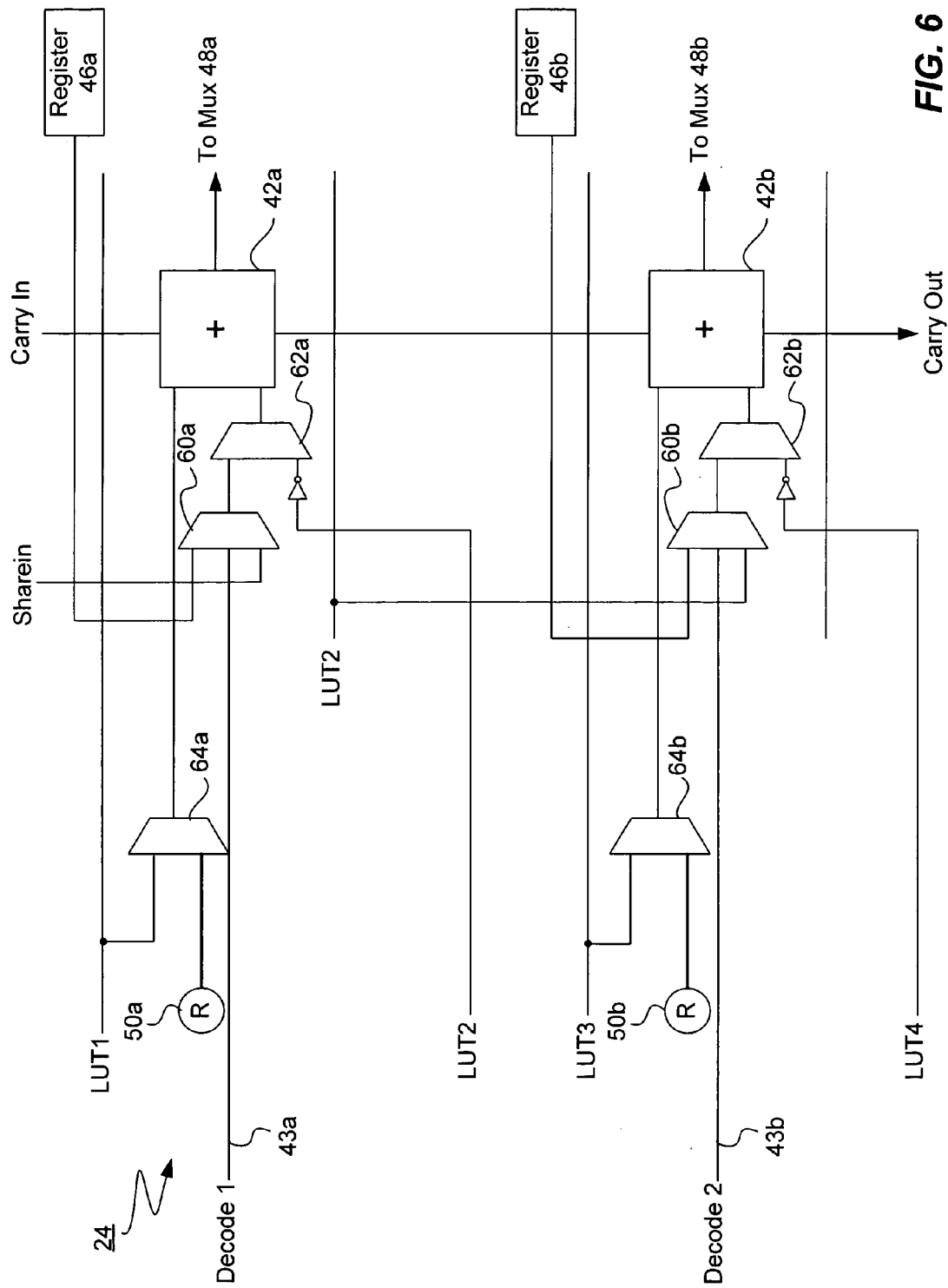
FIG. 6 is a logic diagram illustrating yet another embodiment of the adder function implemented by the ALM according to the present invention.

Referring to FIG. 6, a logic diagram illustrating yet another embodiment of the adder function implemented by the ALM 24 according to the present invention is shown. With this embodiment, one or more of the eight (8) decode input signals 43 usually used for decoding the LUT 40 may be directly applied to inputs of the adders 42*a* and/or 42*b* through a mux. The logic circuit illustrated in FIG. 6 is essentially the same as that illustrated in FIG. 5, with the exception of a first decode signal 43*a* ("Decode 1") being applied to the input of mux 60*a* and a second decode signal 43*b* ("Decode 2") being applied to the input of mux 60*b*. By appropriately controlling the muxes 60*a* and 62*a*, the first decode signal 43*a* can be directly applied to the adder 42*a*. Similarly, by controlling muxes 60*b* and 62*b*, the second decode signal 43*b* (Decode 2) can be directly provided to the adder 42*b*. This arrangement frees the LUT 40 to be used for performing other combinational logic functions, aside from the either one or two decode signals 43 that are applied directly to the adders 42*a* and/or 42*b*. Otherwise the operation of the logic circuit of FIG. 6 is similar to that described above in relation to FIGS. 4 and 5.

The present invention offers a number of advantages. With PLDs, it is common for the adder in a logic block such as an ALM 24 to be adding a single changing value to a constant. In these situations, the look up table is typically being used to generate the constant in prior art devices. With the present invention, however, the constant value is provided directly to the adder, freeing up the look up table to perform other combinational logic functions. The efficiency of the PLD is therefore increased.

Although the present invention was described in the context of a specific type of programmable logic device having LABs and ALMs, it should be noted that the present invention can be practiced and used in any type of programmable logic device capable of performing combinational and/or arithmetic logic and adding. For example, the present invention can be used in programmable gate array (FPGA), including those having ALMs, Logic Elements, or Complex Logic Blocks as their basic logic building block. For more information on Complex Logic Blocks, see the Virtex Family Overview by Xilinx Corporation, Mar. 26, 2005, incorporated by reference herein for all purposes. For more information of Logic Elements, see Altera's Stratix Architecture data sheet, Version 3.1, September, 2004, incorporated by reference herein for all purposes. It should be noted that in this application, the term "logic block" is intended to be broadly construed and cover any type of look up table based logic element, including but not limited to Logic Elements, ALMs, or Complex Logic Blocks.

Figure 7:
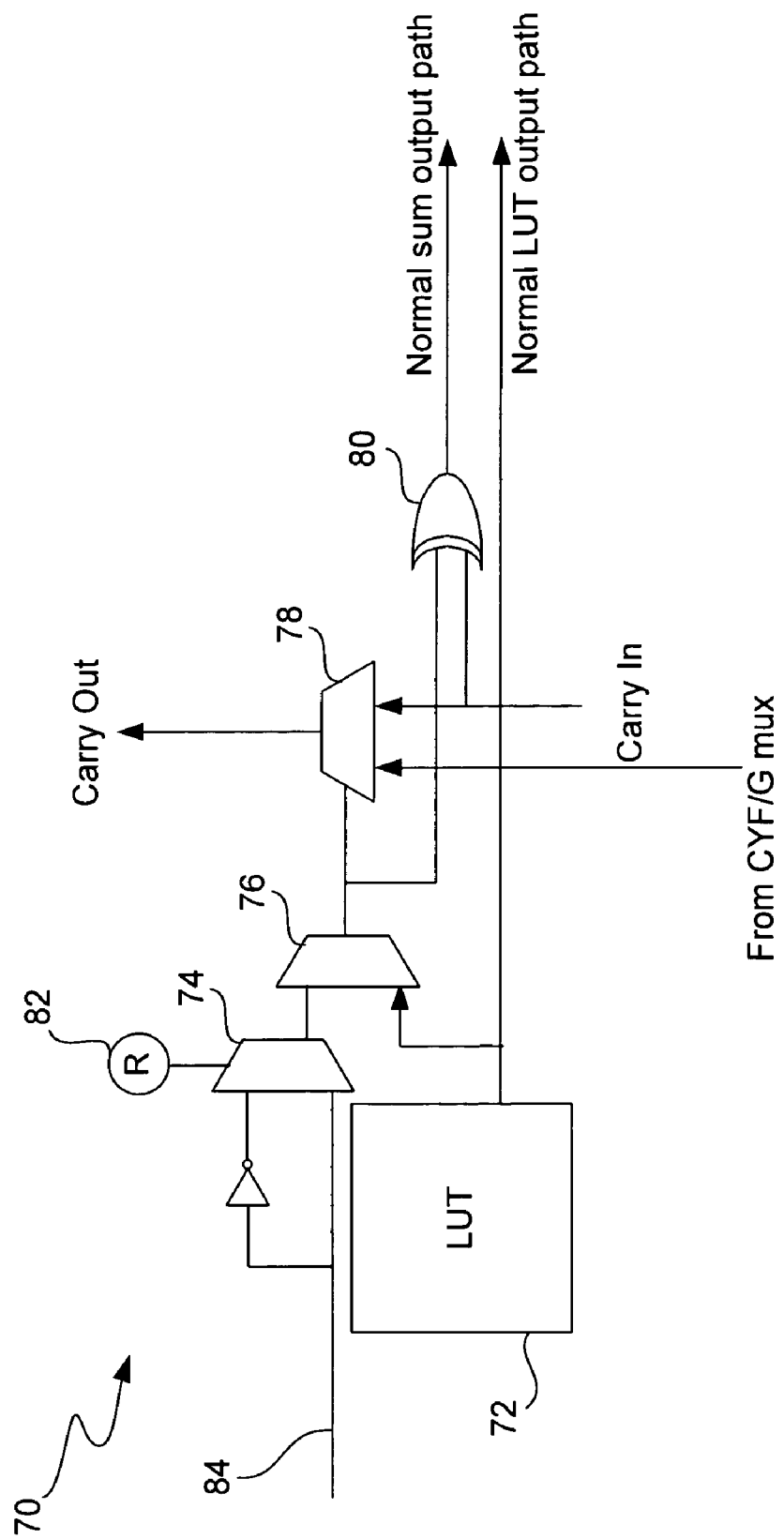
FIG. 7 is a logic diagram illustrating yet another embodiment of the adder function implemented by a Complex logic Block according to the present invention.

Referring to FIG. 7, a diagram of a Complex Logic Block modified to perform the present invention is shown. The Complex Logic Block (CLB) 70 includes a LUT 72, three muxes 74, 76 and 78, a logic gate 80, and a CRAM cell 82. The mux 74 is configured to receive a non-constant value and the inverted non-constant value at its data inputs. The content of the CRAM cell 82 is provided to the select input of the mux 72. Mux 76 is configured to receive the output of mux 74 and the output of LUT 72. Mux 78 is configured to receive a CarryIn signal from the previous CLB and a CYF/G signal at its data inputs and the output of mux 76 at its select input. The logic gate 80 is configured to receive the CarryIn signal and the output of mux 76. With the arrangement shown, mux 74 is functionally acting as an XOR gate with the R value in the CRAM cell 82 and the non-constant value as the operands. Mux 76 provides either the output of the LUT 72 or the output of mux 74 to the mux 78, which is acting as an adder circuit. Thus, by appropriately controlling the muxes 74, 76 and 78, the constant value R in CRAM cell 82 can be directly applied to the adder circuit without first passing it through the LUT 72. In an alternative embodiment, the mux 74 can be replaced by an XOR gate.

Another benefit of the present invention is that it can reduce power consumption of the adder circuitry when the ALM 24 is not in an arithmetic mode. For a normal non-arithmetic operation, the inputs to the adders 42 may fluctuate, depending on the LUT function being implemented and the values of the inputs. As a result, the Carry signal generated by the adder 42 may switch and ripple through a number of adders 42, causing a sudden surge in the dynamic power being consumed. By grounding one of the input pins to the adder, the ripple situation as described above is far less likely to occur. Thus by setting one of the inputs to the adder 42 to ground, power consumption can be reduced.

Yet another advantage is that the present invention allows a carry chain to begin anywhere in a LAB 14, as long as the remainder of the logic in the LAB is not performing arithmetic functions. When performing adding functions, the adders 42 may propagate Carry signals. By grounding one of the inputs to an adder 42 and tying the Carry In to a logic low signal, the Carry Out signal will always be low. Thus, as long as the Carry In at the start of a LAB 14 is tied to low, and all the adders 42 between the first one in the LAB 14 and the desired start of the Carry chain are not in arithmetic mode (i.e., have an input tied to ground), the user can guarantee that the Carry In to the lowest order bit position will be a logic zero. The carry chain can therefore start in that position. The ability to start a carry chain anywhere in a LAB 14 provides additional flexibility in terms of the placement of Carry chains, which may potentially reduce the amount of area needed to implement a particular design or reduce the routing stress of that design.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A programmable logic device, comprising:
    a plurality of logic blocks arranged in a two dimensional array;
    row and column interconnects interconnecting the plurality of logic blocks arranged in the two dimensional array;
    the plurality of logic blocks each being programmable to perform combinational logic and/or adding functions, each of the logic blocks comprising:
        a look up table configurable to perform combinational logic;
        an adder circuit configured to perform adding functions; and
        circuitry configured to directly provide a constant value to the adder circuit without passing the constant value through the look up table, wherein the circuitry is a mux configured to logically act as a XOR gate with the constant value as one of the operands.

2. The programmable logic device of claim 1, wherein the circuitry is a mux capable of selectively providing the constant value to the adder.

3. The programmable logic device of claim 1, wherein the constant value is stored in a memory cell.

4. The programmable logic device of claim 1, wherein the constant value is provided in a configuration memory cell.

5. The programmable logic device of claim 1, wherein the circuitry is further configured to selectively provide one or more of the following types of signals to the adder circuit:
    a combinational logic signal from the look up table;
    a ShareIn signal;
    a register signal indicative of the contents of a register;
    a logic block input that may also be used as a decode signal used for decoding the look up table; and/or
    the constant value.

6. The programmable logic device of claim 1, wherein the look up table is further configured to be fractured to perform more than one combinational logic operation and to generate more than one combinational logic output.

7. The programmable logic device of claim 1, wherein the adder circuit comprises a first adder and a second adder coupled together by a carry signal.

8. The programmable logic device of claim 7, wherein the circuitry is further configured to directly provide a first constant value and a second constant value to the first adder and the second adder without passing the constant value through the look up table respectively.

9. A method of providing a programmable logic device, comprising:
    providing a plurality of logic blocks arranged in a two dimensional array;
    providing row and column interconnects interconnecting the plurality of logic blocks arranged in the two dimensional array;
    the provided logic blocks each being programmable to perform combinational logic and/or adding functions, for each of the provided logic blocks further:
    providing a look up table configurable to perform combinational logic;
    providing an adder circuit configured to perform adding functions; and
    providing circuitry configured to directly provide a constant value to the adder circuit without passing the constant value through the look up table, wherein the provided circuitry is a mux configured to logically act as a XOR gate with the constant value as one of the operands.

10. The method of claim 9, wherein the provided circuitry further comprises providing a mux capable of selectively providing the constant value to the adder.

11. The method of claim 9, wherein the provided constant value is stored in a provided memory cell.

12. The method of claim 9, wherein the provided constant value is stored in a provided configuration memory cell.

13. The method of claim 9, wherein the provided circuitry is further configured to selectively provide one or more of the following types of signals to the adder circuit:
    a combinational logic signal from the look up table;
    a ShareIn signal;
    a register signal indicative of the contents of a register;
    a decode signal used for decoding the look up table; and/or
    the constant value.

14. The method of claim 9, wherein the provided look up table is further configured to be fractured to perform more than one combinational logic operation and to generate more than one combinational logic output.

15. The method of claim 9, wherein providing the adder circuit further comprises providing a first adder and a second adder coupled together by a carry signal.

16. The method of claim 9, wherein the provided circuitry is further configured to directly provide a first constant value and a second constant value to the first adder and the second adder without passing the constant value through the look up table respectively.

17. A programmable logic device, comprising:
   a look up table configurable to perform combinational logic;
   an adder circuit configured to perform adding functions; and
   circuitry configured to directly provide a constant value to the adder circuit without passing the constant value through the look up table, wherein the circuitry is a mux configured to logically act as a XOR gate with the constant value as one of the operands.

18. The programmable logic device of claim 17, wherein the circuitry comprises one or more muxes.

19. The programmable logic device of claim 17, wherein the circuitry is further configured to selectively provide one or more of the following types of signals to the adder circuit:
   a combinational logic signal from the look up table;
   a ShareIn signal;
   a register signal indicative of the contents of a register;
   a decode signal used for decoding the look up table; and/or
   the constant value.

20. The programmable logic device of claim 17, wherein the adder circuit further comprises a first adder and a second adder coupled together in a chain.

21. The programmable logic device of claim 17, further comprising an output mux configured to receive the output of the adder.

22. The programmable logic device of claim 17, further comprising an adaptive logic element, the adaptive logic element comprising the look up table configurable to perform combinational logic, the adder circuit configured to perform adding functions; and the circuitry configured to directly provide the constant value to the adder circuit without passing the constant value through the look up table.

23. The programmable logic device of claim 17, further comprising a logic element, the logic element comprising the look up table configurable to perform combinational logic, the adder circuit configured to perform adding functions; and the circuitry configured to directly provide the constant value to the adder circuit without passing the constant value through the look up table.

24. The programmable logic device of claim 17, further comprising a complex logic block, the complex logic block comprising the look up table configurable to perform combinational logic, the adder circuit configured to perform adding functions; and the circuitry configured to directly provide the constant value to the adder circuit without passing the constant value through the look up table.

25. The programmable logic device of claim 17, wherein the circuitry is a XOR gate with the constant value as one of the XOR gate operands.

26. The programmable logic device of claim 1, further comprising a programmable ground circuit, coupled to an input of the adder circuit, the programmable ground circuit being configurable to provide a ground signal to the adder circuit to prevent an output of the adder from rippling to a second adder in the programmable logic device.

27. The programmable logic device of claim 1, wherein each of the logic blocks further comprises:
   a plurality of the adders;
   a plurality of carry chain interconnects coupled between the plurality of adders respectively, the plurality of adders and carry chain interconnects defining a carry chain; and
   a carry chain start circuit configured to selectively define a starting point in the carry chain, the carry chain start circuit configured to define the starting point in the carry chain by selectively grounding: (i) inputs to a selected one of the adders; and (ii) the carry chain interconnect corresponding to the selected one of the adders.

* * * * *